Dec. 9, 1969 J. J. COYNE 3,483,437

DETECTING SWITCH MEANS

Filed Oct. 23, 1965 3 Sheets-Sheet 1

INVENTOR
John J. Coyne

Dec. 9, 1969 J. J. COYNE 3,483,437

DETECTING SWITCH MEANS

Filed Oct. 23, 1965 3 Sheets-Sheet 2

INVENTOR

John J. Coyne

INVENTOR
John J. Coyne

United States Patent Office 3,483,437

Patented Dec. 9, 1969

3,483,437

DETECTING SWITCH MEANS

John J. Coyne, Philadelphia, Pa., assignor to Robertshaw Controls Company, Richmond, Va., a corporation of Delaware Filed Oct. 23, 1965, Ser. No. 503,997

Int. Cl. H01h *47/12, 47/32;* H03b *5/00*

U.S. Cl. 317—146 9 Claims

This invention relates to means for detecting the proximity of various objects and the like and performing a switching function in response to a predetermined degree of proximity.

It is an object of this invention to provide a new and novel proximity responsive switching means including variable impedance proximity detecting means.

Another object of this invention is to provide a new and novel capacitance responsive proximity switching means having optimized sensitivity and stability whereby the proximity detection of materials having a wide range of dielectric constants can be readily effected.

Still another object of this invention is to provide a new and novel capacitance responsive proximity switch means having a novel variable capacitance detecting element.

Still another object of this invention is to provide a new and novel capacitance responsive proximity switch means having a new and novel oscillator circuit therein.

Still another object of this invention is to provide a new and novel capacitance responsive proximity switch means which precludes response ambiguity or reversal of transfer characteristics in the event of large capacitance unbalance or resistive losses at the detector means thereof.

Yet another object of this invention is to provide a capacitance responsive proximity switch means wherein the cost of same is optimally low with respect to the performance desired.

These and other objects of this invention will become more fully apparent with reference to the following specification and drawings which relate to some preferred embodiments of the invention.

Figure 1:
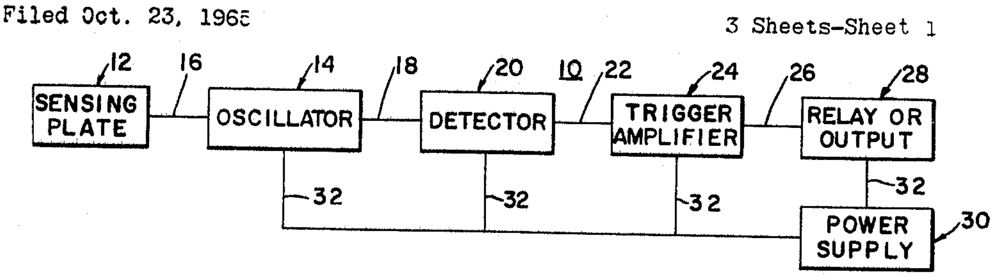
FIGURE 1 is a block diagram of a proximity switch means of the present invention.

Referring in detail to the drawings and more particularly to FIGURE 1, the capacitance responsive proximity switch means 10 of the present invention is shown as comprising a capacitance sensing detector means 12, an oscillator circuit 14 having the detector means 12 connected at its input 16 and having an output 18, a detector 20 connected to the output 18 and having an output 22, a trigger amplifier 24 having an input connected to detector output 22 and an output 26, an output transducer 28 connected at the output 26, and a power supply 30 having a plurality of outputs 32 respectively connected with the oscillator 14, detector 20, trigger amplifier 24 and output transducer 28.

Figure 2:
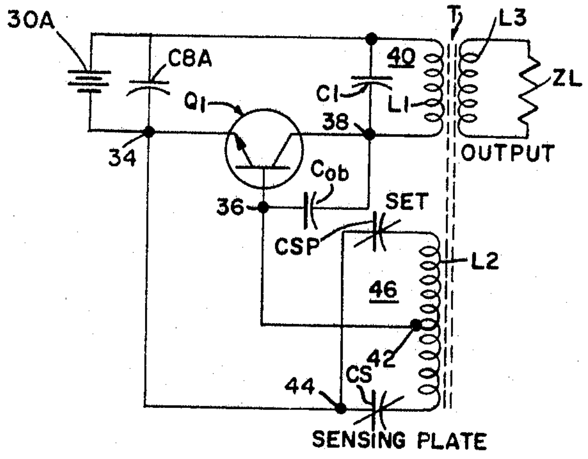
FIGURE 2 is a schematic diagram of the type of oscillator circuit incorporated in the present invention.

Referring now to FIGURE 2, the basic type oscillator circuit embodied in the oscillator 14 of FIGURE 1 is shown schematically as including a single transistor Q1 having emitter, base and collector terminals 34, 36 and 38, respectively.

A tank circuit 40 comprising a parallel connected tuning capacitance C1 and an inductance L1, the latter comprising the primary of a transformer T, is connected between the collector terminal 38 and the positive side of a power source 30A. The negative side of the power source 30A connects with the emitter terminal 34. A capacitor C8A is connected across the power source 30A to provide an alternating current path.

The base terminal 36 is directly connected to the center tap 42 of a feedback coil L2 on the transformer T. The feedback coil L2 is shunted by a variable set point capacitance CSP and a condition responsive variable sensing capacitance CS connected in series at a common junction 44. The junction 44 is connected directly to the emitter terminal 34. Thus, the center-tapped feedback coil L2 and the two capacitances CSP and CS are connected to form an L–C bridge circuit 46.

The output capacitance Cob of the transistor Q1 is illustrated as a lumped capacitance element connected between the base and collector terminals 36 and 38, respectively.

The circuit is completed by an output or secondary winding L3 on the transformer T having a load impedance $Z_L$ connected thereacross.

The circuit of FIGURE 2, because of the location of the tank circuit 40, may be characterized as a tuned collector oscillator.

Figure 3:
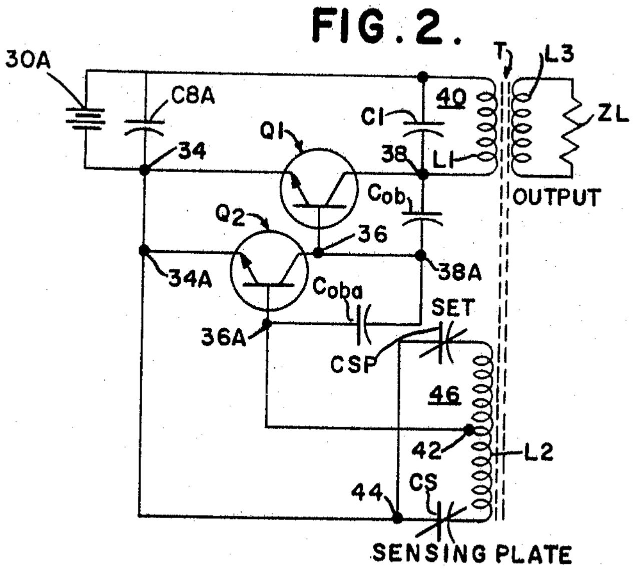
FIGURE 3 is a schematic circuit diagram of an oscillator circuit similar to that of FIGURE 2 as improved by the present invention.

Referring now to FIGURE 3, the basic oscillator circuit of FIGURE 2 is shown in a substantially modified embodiment thereof for reasons to be fully elaborated upon in the description of operation of the present invention.

With all like elements to FIGURE 2 bearing like numerals, the circuit of FIGURE 3 is shown as including a second transistor Q2, of like polarity to the transistor Q1, having emitter, base and collector terminals 34A, 36A and 38A, respectively. The emitter terminal 34A is connected directly to emitter terminal 34, the collector terminal 38A is connected directly to the base terminal 36 and the base terminal 36A is connected directly to the center tap 42 on the feedback coil L2 in the bridge circuit 46.

The output capacitance Coba of the second transistor Q2 is shown as a lumped capacitance element connected between the base and collector terminals 36A and 38A, respectively of the said second transistor.

Figure 4:
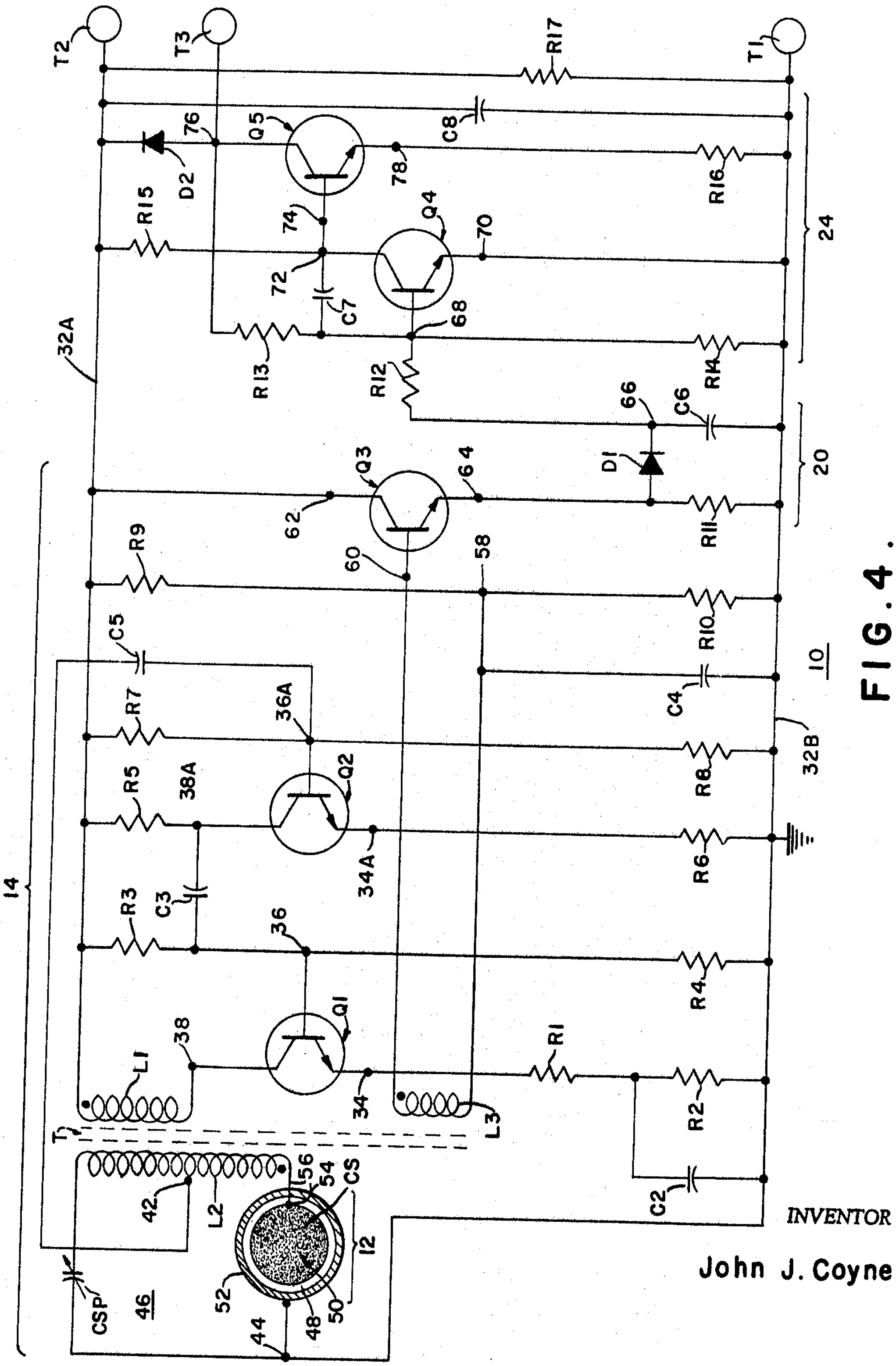
FIGURE 4 is a detailed schematic of a portion of the system of FIGURE 1.
Figure 5:
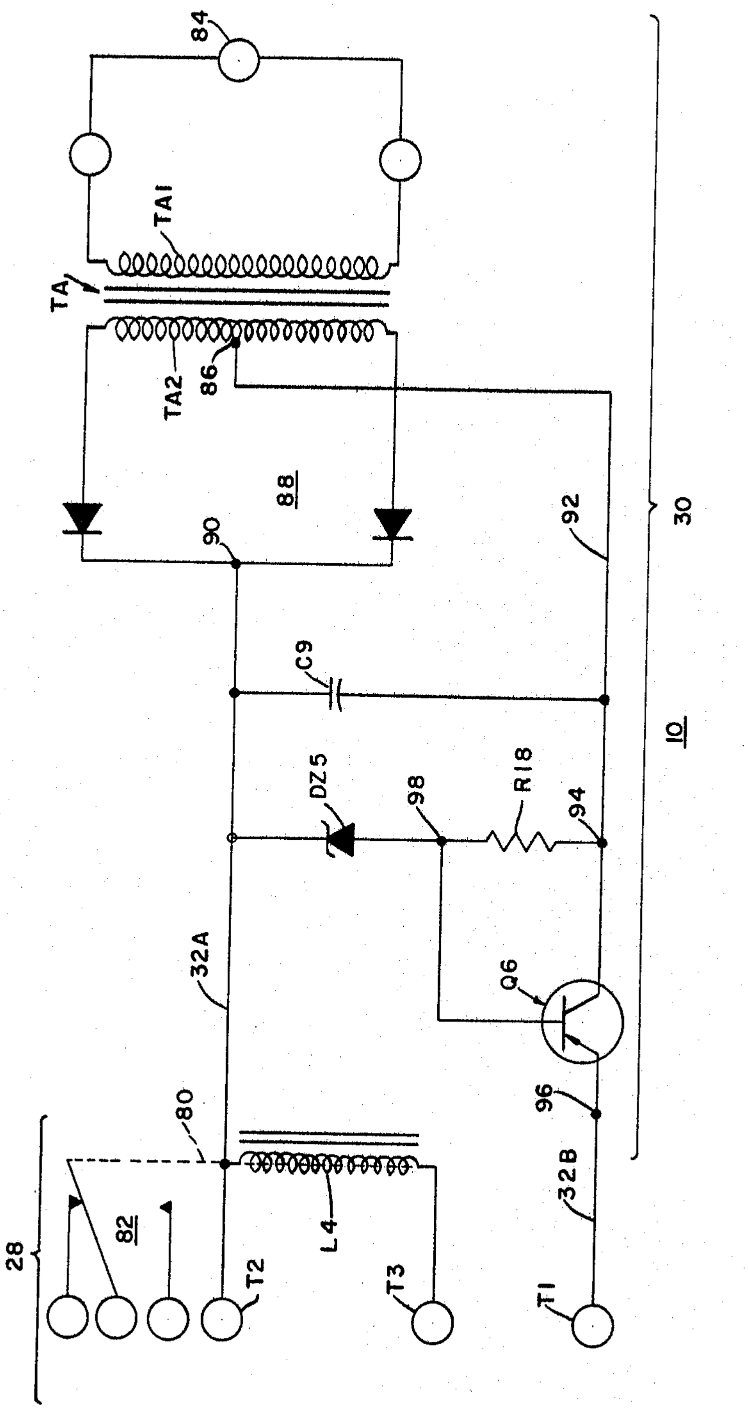
FIGURE 5 is a detailed schematic of the remainder of the system of FIGURE 1 as set forth in detail in FIGURE 4.

Referring jointly to FIGURES 4 and 5, a preferred practical embodiment of the invention is shown, including a further substantially modified embodiment of the circuits of FIGURES 2 and 3 for reasons to be fully elaborated upon in the description of operation of the present invention.

The sensing capacitance CS comprises the sensing plate 12 of the proximity sensing switch means 10. The plate 12 is illustrated as comprising a dielectric glass base 48 having a conductive layer 50 of silver or the like fired thereon, the glass base 48 being mounted in a conforming metal casing 52 by means of epoxy cement or the like. The conductive layer 50 is connected with one end of the feedback winding L2 by means of a solder connection 54 and a fine wire lead 56 extending therefrom. The case 52 is directly connected to the common circuit junction 44 in the bridge circuit 46.

The power leads of the proximity switch means 10 comprise positive and common leads 32A and 32B, respectively. The common leads 32B in FIGURES 4 and 5 are adapted to be connected via terminals T1, the positive power leads 32A are adapted to be connected via terminals T2 and the output means 28 connected with the trigger amplifier 24 via the terminals T3, whereby FIGURES 4 and 5 together form the complete proximity switch means 10.

In the oscillator circuit 14, wherein like parts to FIGURES 2 and 3 bear like numerals, the tank inductance L1 is combined with a tuning capacitance which is derived from the various interelectrode capacitances of the transistors Q1 and Q2, the winding capacitances of the transformer T and the reflected capacitance values from the bridge circuit 46. Thus, the collector 38 of the first transistor Q1 is connected to one side of the tank inductance L1, the latter being connected at its other end to the positive power lead 32A, no tuning capacitance per se being illustrated as a lumped parameter.

The emitter terminal 34 of the first transistor Q1 is connected through an unbypassed resistance R1 and a bypassed series resistance R2, the latter being in parallel with a bypass capacitance C2, with the common lead 32B.

The base terminal 36 of the first transistor Q1 is connected as the common junction in a voltage divider comprised of third and fourth resistances R3 and R4, respectively, connected in series from the positive power lead 32A to the common lead 32B.

The collector 38A of the second transistor Q2 is coupled via a coupling capacitance C3 with the base terminal 36 of the first transistor Q1 and through a fifth resistance R5 with the positive power lead 32A.

The emitter 34A of the second transistor Q2 is coupled through a sixth resistance R6 with the common lead 32A.

The base 36A of the second transistor Q2 is connected through a coupling capacitor C5 with the center tap 42 of the feedback winding L2 and is the common junction of a voltage divider comprised of seventh and eighth resistances R7 and R8, respectively, connected in series from the positive lead 32A to the common lead 32B.

The output coil L3 of the oscillator 14 is connected on one side to a common junction 58 of a voltage divider comprised of ninth and tenth resistances R9 and R10, respectively, connected from the positive lead 32A to the common lead 32B, the resistance R10 being bypassed by a capacitance C4 connected from the junction 58 to the common lead 32B. The other side of the output coil L3 is connected directly to the base 60 of a third transistor Q3, the latter having a collector 62 and an emitter 64 and being connected as an emitter follower output stage for the oscillator 14. This is effected by directly connecting the collector 62 with the positive lead 32A and connecting the emitter 64 through a load resistance R11 to the common lead 32B.

The detector stage 20 of the proximity switch means 10 comprises a diode D1 connected at its anode to the emitter 64 of the emitter follower transistor Q3 and at its cathode to a circuit junction 66, the latter being connected through a filter capacitor C6 with the common power lead 32B and through a coupling resistance R12 to the base terminal 68 of a fourth transistor Q4, the said base terminal 68 comprising an input terminal of the output amplifier stage 24.

The output amplifier stage 24 comprises a bistable flip-flop circuit including the fourth transistor Q4 and a fifth transistor Q5. The fourth transistor Q4 includes emitter and collector terminals 70 and 72, respectively, and the fifth transistor Q5 includes base, emitter and collector electrodes 74, 76 and 78, respectively.

The base 68 of the fourth transistor Q4 comprises the common junction of a voltage divider comprised of series connected thirteenth and fourteenth resistances R13 and R14, the former being connected to the collector 76 of the fifth transistor Q5 and the latter being connected to the common lead 32B. The base 68 is further connected via a capacitance C7 with the collector 72 of the fourth transistor, the said collector 72 being directly connected to the base 74 of the fifth transistor Q5.

The remaining connections of the fourth transistor Q4 comprise a direct connection of the emitter 70 to the common lead 32B and the connection of the collector 72 to the positive power lead 32A through a fifteenth resistance R15.

The remaining connections of the fifth transistor Q5 comprise the connection of the emitter 78 with the common lead 32B through a sixteenth resistance R16 and the connection of the collector 76 through the anode-cathode path of a blocking diode D2 to the positive power lead 32A. The collector 76 is an output terminal of the output amplifier 24.

A capacitance C8 and a resistance R17 connected in parallel, are provided across the power leads 32A and 32B as shown, adjacent the terminals T1, T2 and T3.

The output means 28 comprises a relay coil L4 connected from the terminal T2 to the terminal T3, the latter being synonymous with the collector 76 of the fifth transistor Q5 in the output amplifier 24, an armature 80, as shown in dotted line illustration in FIGURE 5, and a double throw switch assembly 82 actuated by said armature 80 in response to the state of energization of the relay coil L4.

The power supply 30 is shown in FIGURE 5 as comprising an input transformer TA connected at its primary TA1 across an alternating current power source 84 and including a center tapped secondary TA2, having a center tap 86, across which secondary TA2 is connected a full wave rectifier means 88 comprising diodes D3 and D4 having a common cathode connection 90 at the positive power lead 32A.

The center tap 86 is connected via a lead 92 to the collector terminal 94 of a sixth transistor Q6 of opposite polarity to the other transistors in the switch means 10.

The sixth transistor Q6 has an emitter terminal 96 and a base terminal 98, the emitter-collector path thereof being in series with the common power lead 32B, the latter being connected at the emitter terminal 94.

The base terminal 96 comprises the common terminal of a voltage divider comprised of a Zener diode DZ5 and an eighteenth resistance R18, connected, with the cathode of the Zener diode DZ5 at the positive power lead 32A, from the said positive lead 32A to the collector terminal 92, corresponding to the center tap 86 of the input transformer TA.

A filter capacitor C9 is connected between the common cathode connection 90 and center tap 86 in the full wave rectifier means 88 to complete the circuit of the switch means 10.

OPERATION

Referring first to the schematic system diagram of FIGURE 1, the general operation of the proximity sensing switch means 10 will now be described.

Assuming that no object to be detected is within a selected sensitivity range of proximity to the sensing plate 12 and the power supply 30 is energized, the oscillator 14 is designed to oscillate and produce an output wave at a maximum predetermined amplitude. The detector 20 receives the oscillator output via output circuit means 18 and generates a direct current signal of a strength proportional to the amplitude of oscillation of the output signal of the oscillator 14.

The direct current signal from the detector holds the bistable output amplifier 24 in a predetermined operating state such that energization of the output means 28 via the amplifier output circuit 26 is precluded.

The foregoing response is effected by the change in capacitance at the sensing plate 12 as will be more fully described in connection with the operation of the circuit of FIGURES 2, 3, 4 and 5.

In the basic, tuned collector, single transistor oscillator circuit of FIGURE 2, the transformer T is connected such that the feedback winding L2 provides a signal at the base 36 of the transistor Q1 which is reversed in phase from the output voltage at the collector 38. The L–C bridge circuit 46 is adjusted by means of the set point capacitance CSP to effect a positive feedback over the operating range of variables of the sensing capacitance CS to insure that the signal fed back to the base 36 comprises a positive feedback, causing the circuit to oscillate. Thus, depending on the relative magnitudes of capacitance of the set point and sensing capacitances CSP and CS, respectively, the oscillations applied to the load ZL via the output winding L3 can be either initiated, terminated or modulated in amplitude.

A serious fault in basic oscillator circuits of this type with regard to instability and spurious oscillations is caused by the output capacitance Cob of the transistor Q1. This capacitance is non-linear (voltage variable) and is reflected into the L–C bridge 46, thereby creating an unbalancing effect on the feedback circuit of the oscillator.

The effect of the output capacitance Cob is precluded by the oscillator circuit of FIGURE 3.

The use of the transistors Q1 and Q2 connected in cascade relationship results in an increase in gain in the oscillator circuit thereby increasing the sensitivity of the proximity detection effected thereby. Further, the first and second output capacitances in the series connection of FIGURE 3 carry voltages which are respectively out of phase and thereby cancel out the effects of the output capacitance. As a result, stability and reliability are enhanced in a substantial degree over the circuit of FIGURE 2, the L–C bridge 46 being now unaffected by ouput capacitance of the active circuit elements in the oscillator circuit.

Referring now to FIGURES 4 and 5 and assuming energization of the power supply 30 by the power source 84, the oscillator 14 will oscillate at a predetermined maximum amplitude in the absence of a proximate object at the sensing capacitance CS, the said amplitude being determined by the relative adjusted value of the set point capacitance CSP.

Signal feedback from the bridge circuit 46 is effected via the feedback coupling capacitance C5 between the center tap 42 and the base 36A of the second transistor Q2. The positive feedback thus effected subjects the oscillator circuit 14 to the possibility of setting up spurious high frequency oscillations because of the inherently unstable tendencies of such positive feedback arrangements when combined with the effects of interelectrode resistance and capacitance of the transistors in the circuit. Therefore, in order to preclude such a problem the first and second transistors Q1 and Q2 are neutralized.

Such neutralization is effected by the unbypassed resistances R1 and R6 in the emitter circuits of the transistors Q1 and Q2 which neutralize the spurious feedback effects of interelectrode capacitance and resistance and attenuate the high frequency gains of the transistors Q1 and Q2, making the neutralization effective over a substantially wide frequency band.

The oscillations generated by the circuit 14 are inducted in the output winding L3 and fed to the base 60 of the third transistor Q3 in the emitter follower stage of the oscillator 14. This stage precludes undue loading of and resulting instability in the oscillator 14, because of the impedance transformation characteristics of emitter follower circuits.

The emitter current output of the third transistor Q3 produces an output voltage waveform across the resistance R11 and a rectified direct current voltage is produced at the junction 66 across the capacitance C6 of the detector stage 20, the diode D1 acting to rectify the said voltage across the resistance R11.

The voltage at the junction 66 is a maximum when the output of the oscillator 14 is at maximum amplitude, and thus, the voltage at the base 68 of the fourth transistor Q4 in the bistable output amplifier stage 24 is at a maximum proportional value determined by the relative magnitudes of the twelfth and fourteenth resistances R12 and R14.

As a result, the transistor Q4 is turned on and the voltage at the collector 72 thereof is at a minimum. The base 74 of the fifth transistor Q5 is therefore at the same minimum potential as the collector 72 of the fourth transistor Q4 and the fifth transistor Q5 is held in a non-conductive state. Since a non-conductive state exists in the fifth transistor Q5, the voltage at the collector 76 and the circuit terminal T3 is at a maximum with respect to the common power lead 32B.

Correspondingly, the voltage at the collector 76 and terminal T3 is substantially identical with that of the positive power lead 32A and little if any current can flow in the relay coil L4 from the terminal T2 to the terminal T3.

In the event of an object or body of matter moving into proximity with the sensing capacitance CS, the capacitance value thereof will increase and the L–C bridge circuit 46 will become unbalanced, thereby changing the voltage difference across the center tap 42 and circuit junction 44, this voltage difference also being coupled through feedback coupling capacitance C5 and common lead 32B across the eighth resistor R8, thereby changing the bias on the base terminal 36A of the second transistor Q2.

The quiescent capacitance value of the sensing capacitance CS and the set point capacitance value of the set point capacitance CSP are set such that a maximum positive feedback and correspondingly maximum amplitude of oscillation is effected in the oscillator 14. Thus, the proximity of an object or body of matter to the sensing capacitance CS will increase the capacitance value thereof, approaching the higher initial value of the set point capacitance, decreasing the voltage differential from center tap 42 to junction 44 and decreasing the positive feedback signal amplitude and the amplitude of oscillations appearing across the load resistance R11 of the emitter follower stage of the oscillator 14.

Therefore, the detector 20 provides a proportionally decreased input signal at the base terminal 68 of the fourth transistor Q4, causing the transistor Q4 to decrease conduction, increasing the voltage at the collector 72 thereof. Accordingly, the voltage at the base 74 of the fifth transistor Q5 is increased, the transistor Q5 is rendered conductive. The voltage at the collector terminal 76 is thus reduced, thereby reducing the bias voltage to the base of the fourth transistor Q4, causing the said transistor Q4 to rapidly cutoff and causing the fifth transistor Q5 to reach maximum conduction.

Conduction of the fifth transistor Q5 results in a sudden drop in the voltage of its collector terminal 76 and a corresponding reduction in the voltage of the circuit terminal T3. Therefore, a substantial potential difference is now present across the relay coil L4 from the terminal T2 to the terminal T3 and the armature 80 actuates the relay contacts 82 in the output means 28.

Upon de-energization of the relay coil L4 reverse current flow therein is precluded by the blocking diode D2.

Thus, the proximity switch means 10 has performed a controlled switching function in response to a predetermined degree of proximity of an object or body of matter to the sensing means 12 thereof.

The power supply 30 may be of the battery type but is illustrated as an A.C. to D.C. converter, utilizing the Zener diode DZ5 to regulate the voltage output across the power leads 32A and 32B.

The capacitance C7 bypasses transient supply voltage fluctuations from the base 74 of the fifth transistor Q5, thereby preventing false triggering of the output trigger state 24.

The seventeenth resistance R17, connected in parallel with the capacitance C8, is of a relatively high dissipation type compared with the other resistances in the switch means 10 to provide a continuous heating effect.

The capacitance C8 serves as the A.C. return for the oscillator 14 and acts to preclude any high frequency oscillations from appearing on the leads at the power supply 30.

All of the circuit means of FIGURE 4 are adapted to be enclosed within the metal casing 52 which includes the conductive layer 50 of the sensing plate 12 (sensing capacitance CS) as an outer end wall thereof.

The effect of the heater resistance R17 is to raise the temperature of the casing 52 and its contents a few degrees above ambient temperature. As a result, moisture will be precluded from condensing on the conductive surface 50 of the sensing capacitance CS and thereby causing a shift in the predetermined operating point of the switch means 10.

The circuit means of FIGURE 5 is adapted to be externally connected with the circuit means of FIGURE 4 in respect to the casing 52, by means of the terminals T1, T2 and T3.

The characteristic of a flip-flop circuit to exhibit negative resistance characteristic during triggering is compensated for since the impedance of the detector 20 is linearized by the use of a series coupling resistance R12 and filter capacitor C6 of larger impedance values than would normally be required to drive an ordinary amplifier stage, thereby offsetting the effects of non-linear loading by the flip-flop output trigger stage 24.

The above-described invention provides a new and novel proximity switch means which satisfies a long felt need in the art for such a control means having both optimized sensitivity and optimized stability. In addition, the main transducing means of the present invention comprising the novel sensing means 12 and novel oscillator circuit 14 provide an enhanced stability and sensitivity comprising a substantial advancement in the art. The combination of this novel transducing means with a bistable output amplifier such as the amplifier 24 provides a positive control actuation of the output means 28 which in one of the embodiments described herein is illustrated as a relay. Other suitable output means responsive to an output voltage function may be utilized.

It is to be understood that the embodiments of the invention shown and described herein are for the purpose of example and are not intended to limit the scope of the appended claims.

What is claimed is:

1. Proximity switch means for detecting the presence of a body of material and performing a control switching function in response to a predetermined proximity thereof comprising a power source, capacitive sensing means effecting a capacitive change as a function of the relative proximity thereto of a body of material, oscillator means energized by said power source effecting an output signal of a predetermined amplitude of oscillation in the event of the absence of a body of material within a first predetermined proximity of said sensing means and effecting a modulation of said amplitude as a function of the proximity of said body to said sensing means within said first predetermined proximity, control output means connected with said oscillator means to receive said output signal including bistable multiple state amplifier means selectively switched between said states upon the advent of a second predetermined proximity of said body to said sensing means in response to a functionally related second predetermined amplitude of said output signal and providing a control signal in response to said change of state, and switch means energized by said control signal effecting a predetermined control switching function, said oscillator means including a feedback circuit comprising a four terminal impedance bridge including said sensing means and a variable capacitive set point means as first and second legs thereof and having third and fourth fixed impedance legs, said fixed impedance legs being energized by said output signal, said feedback circuit providing a regenerative feedback signal across the diagonal of said bridge defined by common connections between said first and second legs and said third and fourth legs, respectively, said regenerative feedback signal having an amplitude modulated as a function of the differential impedance value between said sensing and said set point means and controlling said amplitude of oscillation of said output signal, said oscillator means further includes first and second transistors having substantially identical output capacitances, first output circuit means interconnecting said first and second transistor means such that the voltages across the respective output capacitances thereof are in phase opposition, tuned circuit means coupling said first output circuit means with said third and fourth legs of said impedance bridge, input circuit means for said transistors interconnected with said impedance bridge across the said diagonal thereof providing said feedback signal, and second output circuit means coupled with said tuned circuit means transmitting said output signal of said oscillator means to said control output means.

2. The invention defined in claim 1, wherein said switch means further includes heater means maintaining the temperature of said capacitive sensing means above ambient temperature thereby reducing the possibility of humidity effecting a capacitive change at said capacitive sensing means.

3. The invention defined in claim 1, wherein said second output circuit means includes an emitter follower circuit connected to said control output means, said emitter follower circuit serving to minimize the effect of any load changes presented by said control output means thereby stabilizing operation of said oscillator means.

4. The invention defined in claim 3, wherein said oscillator means further includes a first unbypassed resistor and a second unbypassed resistor, said first transistor having an emitter electrode connected to said first unbypassed resistor and said second transistor having an emitter electrode connected to said second unbypassed resistor, said first and second transistors thereby being neutralized to prevent said oscillator means from oscillating at spurious frequencies.

5. The invention defined in claim 3, wherein said bistable multiple state amplifier means is a flip-flop circuit which exhibits non-linear loading, said flip-flop circuit including a control electrode, said control output means including a detector network providing an intermediate unidirectional control signal and a resistor connecting said detector network and said control electrode of said flip-flop circuit applying said intermedaite unidirectional control sgnal to said flip-flop circuit, said resistor offsetting the effects of the non-linear loading exhibited by said flip-flop circuit.

6. Transformer-coupled variable-amplitude oscillator means comprising a power source, a coupling transformer, tuned circuit means providing an oscillator output signal including a first winding of said transformer, transistor means including an input circuit and a first output circuit driving said tuned circuit means, feedback circuit means including a second winding of said transformer and a condition responsive variable impedance means providing a variable regenerative feedback signal as a function of the impedance of said variable impedance means at said input circuit and controlling the amplitude of said oscillator output sgnal and a second output circuit including a third winding of said transformer means and an emitter-follower stage energized thereby, said emitter-follower stage precluding loading of said oscillator means; said transistor means including first and second transistors having substantially identical respective output capacitances and said first output circuit including means interconnecting said output capacitances such that the respective voltages thereacross are in phase opposition.

7. The invention defined in claim 6, wherein said first output circuit further includes resistive self-biasing means precluding spurious oscillations in said second output means.

8. The invention defined in claim 6, wherein said feedback circuit means comprises a four terminal impedance bridge comprising a proximity responsive variable capacitance means and variable set point capacitance means as first and second legs thereof, respectively and said second winding of said transformer having a center tap as the third and fourth legs thereof, respectively, and said regenerative feedback signal comprises a variable voltage signal appearing across the diagonal of said bridge comprising said center tap and the common connection between said first and second legs, said voltage being variable as a function of the differential impedance between said proximity responsive and set point capacitance means.

9. The invention defined in claim 8, wherein said first output circuit further includes resistive self-biasing means precluding spurious oscillations in said second output means.

References Cited

UNITED STATES PATENTS

| | | | |
|---|---|---|---|
| 3,081,422 | 3/1963 | Cooper. | |
| 3,128,416 | 4/1964 | Rode | 331—110 X |
| 3,233,126 | 2/1966 | Evalds et al. | 331—110 X |
| 3,246,257 | 4/1966 | Evalds et al. | 331—110 X |
| 3,295,042 | 12/1966 | Evalds et al. | 331—117 X |
| 3,284,724 | 11/1966 | Marlow | 331—117 X |
| 3,147,408 | 9/1964 | Yamamoto et al. | 317—146 |

LEE T. HIX, Primary Examiner

U.S. Cl. X.R.

317—148.5; 331—65, 110, 117, 138, 168